US009905552B1

(12) United States Patent
Yuan et al.

(10) Patent No.: US 9,905,552 B1
(45) Date of Patent: Feb. 27, 2018

(54) ASSIST CUTS DISPOSED IN DUMMY LINES TO IMPROVE METAL SIGNAL CUTS IN ACTIVE LINES OF A SEMICONDUCTOR STRUCTURE

(71) Applicant: GLOBALFOUNDRIES Inc., Grand Cayman (KY)

(72) Inventors: Lei Yuan, Cupertino, CA (US); Xuelian Zhu, San Jose, CA (US); Harry J. Levinson, Saratoga, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/238,107

(22) Filed: Aug. 16, 2016

(51) Int. Cl.
| | | |
|---|---|---|
| H01L 27/118 | (2006.01) |
| H01L 27/02 | (2006.01) |
| H01L 21/308 | (2006.01) |
| H01L 21/84 | (2006.01) |
| H01L 27/12 | (2006.01) |
| G06F 17/50 | (2006.01) |

(52) U.S. Cl.
CPC ...... H01L 27/0207 (2013.01); G06F 17/5077 (2013.01); H01L 21/3086 (2013.01); H01L 21/3088 (2013.01); H01L 21/845 (2013.01); H01L 27/11803 (2013.01); H01L 27/1211 (2013.01)

(58) Field of Classification Search
CPC ................................................ H01L 27/0207
See application file for complete search history.

(56) References Cited

U.S. PATENT DOCUMENTS

| 9,735,029 B1* | 8/2017 | Chu .................. H01L 21/31144 |
| 2007/0288879 A1* | 12/2007 | Kobayashi .......... G06F 17/5072 716/54 |
| 2014/0175565 A1* | 6/2014 | Smayling ............ G06F 17/5068 257/401 |
| 2014/0264894 A1* | 9/2014 | Tien ..................... H01L 23/5223 257/773 |
| 2014/0346677 A1* | 11/2014 | Sonoda ............. H01L 21/76838 257/774 |
| 2015/0339428 A1* | 11/2015 | Yuan ................... G06F 17/5081 716/52 |

* cited by examiner

Primary Examiner — Jamie C Niesz
(74) Attorney, Agent, or Firm — Heslin Rothenberg Farley & Mesiti P.C.; Stephen Scuderi (57) ABSTRACT

A semiconductor structure includes a substrate having a plurality of semiconductor devices disposed therein. A dielectric layer is disposed over the substrate. A plurality of substantially parallel metal lines are disposed in the dielectric layer. The metal lines include active lines for routing signals to and from the devices, and dummy lines which do not route signals to and from the devices. Signal cuts are disposed in the active lines. The signal cuts define tips of the active lines. Assist cuts are disposed exclusively in the dummy lines and do not define tips of the active lines. The assist cuts are located proximate the signal cuts such that a first density of assist cuts and signal cuts in an area surrounding the signal cuts is substantially greater than a second density of signal cuts alone in the same area.

9 Claims, 7 Drawing Sheets

ASSIST CUTS DISPOSED IN DUMMY LINES TO IMPROVE METAL SIGNAL CUTS IN ACTIVE LINES OF A SEMICONDUCTOR STRUCTURE

TECHNICAL FIELD

The present invention relates to semiconductor devices and methods of making the same. More specifically, the invention relates to assist cuts disposed in dummy lines of a semiconductor structure and methods of forming the same. The assist cuts improve the resolution of metal signal cuts in active lines of the semiconductor structure.

BACKGROUND

Self-aligned multiple patterning, such as self-aligned double patterning (SADP), self-aligned quadruple patterning (SAQP) and direct self-assembly (DSA), are a class of technologies that are typically used to print very dense lines, such as lines having 80 nanometers (nm) pitch, 40 nm pitch or less, during the fabrication of ultra-high density semiconductor integrated circuits. These technologies generally pattern a sea (or large array) of parallel metal lines into back-end-of-line (BEOL) dielectric layers during the formation of interconnect systems for front-end-of-line (FEOL) semiconductor devices, such as transistors, resistors, capacitors or the like. The semiconductor devices are formed in an FEOL substrate layer of the semiconductor integrated circuit.

Cut masks are then utilized in a photolithographic process to pattern signal cuts into predetermined locations (or targets) of the sea of metal lines to define the tips of active metal lines and dummy metal lines. The active lines are used to route electric signals, or electric power, to and from the semiconductor devices.

The dummy lines are inactive and do not carry any signals or electric power. The dummy lines are patterned into the BEOL dielectric layer because the self-aligned multiple patterning techniques cannot distinguish between dummy and active lines. Additionally, it would become very expensive to develop a complex mask to pattern exclusively active lines.

However, due to the high density of the metal lines and the small tip to tip distances (widths), e.g. 30 nm or less, between the signal cuts, it is a significant challenge to control the cut mask's edges to prevent undercuts or unwanted cuts of a signal cut target on a specific section of a metal line. An undercut is where a targeted line may only be partially cut. An unwanted cut is where lines adjacent to the targeted line may inadvertently be cut. Both the undercuts and unwanted cuts will adversely affect system performance.

Further, a light source passing through a cut mask during a photolithographic process to illuminate a target is always subject to a certain magnitude of process errors such as focus and exposure errors that cause distortion in the images that are used to form the signal cuts. The processed images often appear with irregularities such as line widths that are narrower or wider than the design of the target image.

This distortion problem is significantly exacerbated when the signal cuts form a sparsely distributed pattern, as opposed to a densely distributed pattern, within the highly dense sea of metal lines. This is because it is virtually impossible to optimize illumination conditions in a photolithographic process for both dense lines and sparse cut patterns. Therefore, in a sparse pattern of signal cuts, the variations in the critical dimensions and other measurable features of the cuts may be three times or more than that of a dense pattern of signal cuts.

For purposes herein, a dense pattern of signal cuts is where the spaces between the cuts will approach the width of the cuts themselves. For example, in a dense pattern of signal cuts the spaces between the cuts may be less than three times the width of the cuts and preferably less than two times the width of the cuts. Also for purposes herein, in a sparse pattern of signal cuts the spaces between the cuts may be greater than three, five or more times the width of the cuts. Also, by comparison, the density of signal cuts (i.e., the number of signal cuts per unit area) for a dense pattern of cuts will generally be at least two times the density of a sparse pattern of signal cuts.

Optical proximity correction (OPC) technology can be used to reduce the above described image variations and errors by moving edges or adding features, such as sub-resolution assist features, to the pattern written into the cut masks used during the photolithographic process. However, even with the most sophisticated OPC techniques, the variations in a sparse signal cut pattern will still be on the order of three times greater than that of a dense signal cut pattern for the same size cuts.

Accordingly, there is a need for an apparatus and method to improve the resolution of metal signal cuts in active lines of a semiconductor structure. More specifically, there is a need to improve the resolution and variation of signal cuts in a sparse pattern of signal cuts. Further there is a need to improve the resolution of signal cuts which define the tip ends of active metal lines in a sea of metal active and dummy lines, wherein the metal lines have a pitch of 80 nm or less.

BRIEF DESCRIPTION

The present invention offers advantages and alternatives over the prior art by providing an apparatus and method of making the same of a semiconductor structure having assist cuts disposed in dummy lines of the semiconductor structure. The assist cuts improve the resolution of metal signal cuts in active lines of the semiconductor structure by increasing the density of combined assist cuts and signal cuts in an area surrounding the signal cuts relative to the density of the signal cuts alone in the same area. Essentially a sparse pattern of signal cuts disposed in a dense sea of metal lines can be converted into a dense pattern of signal cuts plus assist cuts in order to reduce photolithographic image distortions used to form the signal cuts.

A semiconductor structure in accordance with one or more aspects of the present invention includes a substrate having a plurality of semiconductor devices disposed therein. A dielectric layer is disposed over the substrate. A plurality of substantially parallel metal lines are disposed in the dielectric layer. The metal lines include active lines for routing signals to and from the devices, and dummy lines which do not route signals to and from the devices. Signal cuts are disposed in the active lines. The signal cuts define tips of the active lines. Assist cuts are disposed exclusively in the dummy lines and do not define tips of the active lines. The assist cuts are located proximate the signal cuts such that a first density of assist cuts and signal cuts in an area surrounding the signal cuts is substantially greater than a second density of signal cuts alone in the same area.

A method in accordance with one or more aspects of the present invention includes providing a semiconductor structure wherein the structure includes a substrate having a plurality of semiconductor devices disposed therein, and a dielectric layer disposed over the substrate. A first electronic design automation (EDA) tool is utilized to generate a routing layout for active lines, dummy lines and signal cuts to be disposed in the dielectric layer. A second EDA tool is utilized to develop a software solution for a combined pattern of assist cuts and the signal cuts. The assist cuts are located proximate the signal cuts such that a density of assist cuts and signal cuts in an area surrounding the signal cuts is substantially greater than a second density of signal cuts alone in the same area. At least one cut mask is developed from the software solution. The cut mask is utilized to form the active lines, dummy lines and combined pattern within the dielectric layer.

DRAWINGS

The invention will be more fully understood from the following detailed description taken in conjunction with the accompanying drawings, in which.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1A-3 illustrate various prior art exemplary embodiments of semiconductor structures having signal cuts disposed in an array of metal lines. The signal cuts define active metal lines of a BEOL interconnect system disposed in a dielectric layer of the structure. The active lines route signals or power to and from FEOL devices located in a substrate layer of the semiconductor structures.

FIGS. 4-6B illustrate various exemplary embodiments of a semiconductor structure and method of making the same, wherein the structure has assist cuts disposed in dummy lines of the semiconductor structure in accordance with the present invention. The assist cuts improve the resolution of metal signal cuts in active lines of the semiconductor structure by increasing the density of combined assist cuts and signal cuts in an area surrounding the signal cuts relative to the density of the signal cuts alone in the same area.

Figure 1A:
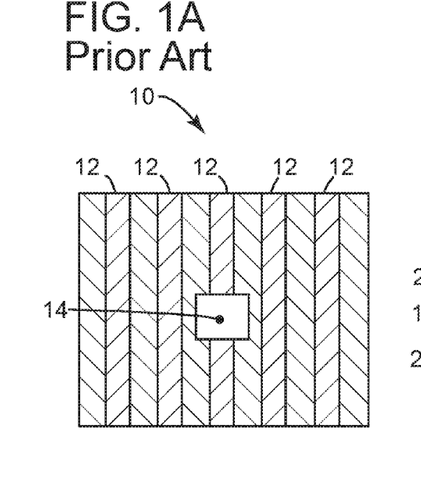
FIG. 1A is an exemplary embodiment of a top view of a portion of a semiconductor structure having a prior art signal cut target superimposed thereon.
Figure 1B:
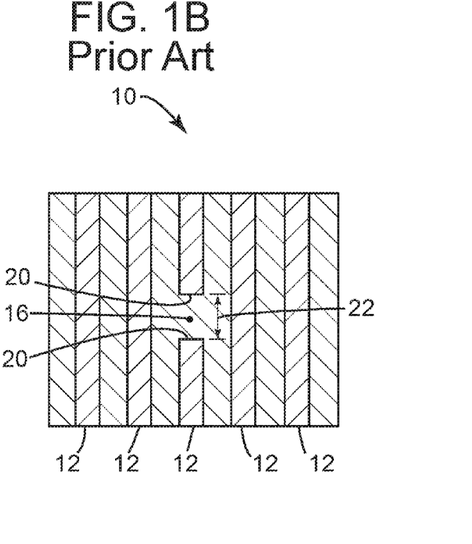
FIG. 1B is an exemplary embodiment of a prior art signal cut perfectly placed over the signal cut target of FIG. 1A.

Referring to FIGS. 1A and 1B, exemplary embodiments of top views of a portion of a semiconductor structure 10 having a prior art signal cut target 14 (FIG. 1A) and a perfectly placed prior art signal cut 16 (FIG. 1B) respectively are presented. In FIG. 1A semiconductor structure 10 has an array (or sea) of metal lines 12 dispose therein with the predetermined signal cut target (or targeted location) 14 for the signal cut 16 superimposed thereon.

In FIG. 1B, a cut mask (not shown) is utilized in a photolithographic process to pattern the signal cut 16 into the exact location of the signal cut target 14. The signal cut 16 defines the tips 20 of two metal lines 12.

The metal lines 12 have a high pitch density. More specifically, the metal lines in this prior art embodiment have a pitch 18 (the distance between repetitive features on the structure) of 80 nm or less and preferably a pitch of 40 nm or less. Additionally, the signal cut 16 defines tips 20 which have a tip to tip distance (or width) 22 that is also aggressively small. More specifically, the tip to tip width 22 in this embodiment is 30 nm or less.

Figure 1C:
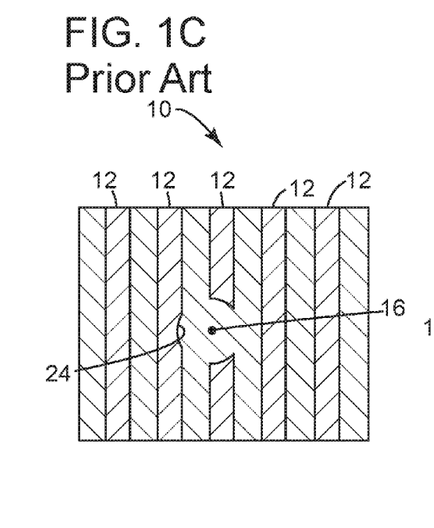
FIG. 1C is an exemplary embodiment of a prior art unwanted cut.

Referring to FIG. 1C, an exemplary embodiment of a top view of an imperfectly landed signal cut 16 on structure 10 is presented. Unfortunately, due to the dense pitch 18 of the metal lines 12 and the small tip to tip width 22 defined by the signal cut 16, it is a significant challenge to control the lithographic process such that the signal cut 16 lands perfectly on the signal cut target 14. Additionally a light source passing through the cut mask during the lithographic process of patterning signal cut 16 is always subject to a certain magnitude of process errors such as focus and exposure errors. Accordingly, the processed image of the signal cut 16 may be wider or narrower and/or may not land perfectly on the target 14. In this particular case the imperfect landing of signal cut 16 has produced an unwanted cut 24 of a metal line 12 adjacent to the targeted line.

Figure 1D:
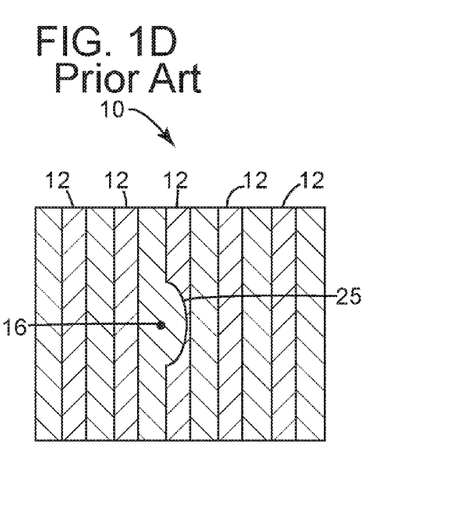
FIG. 1D is an exemplary embodiment of a prior art undercut.

Referring to FIG. 1D, another exemplary embodiment of a top view of an imperfectly landed signal cut 16 on structure 10 is presented. In this particular case the imperfect landing of signal cut 16 has produced an undercut 25. An undercut 25 is where a targeted line 12 is only partially cut through. Both the undercuts 25 and unwanted cuts 24 will adversely affect system performance.

Figure 2:
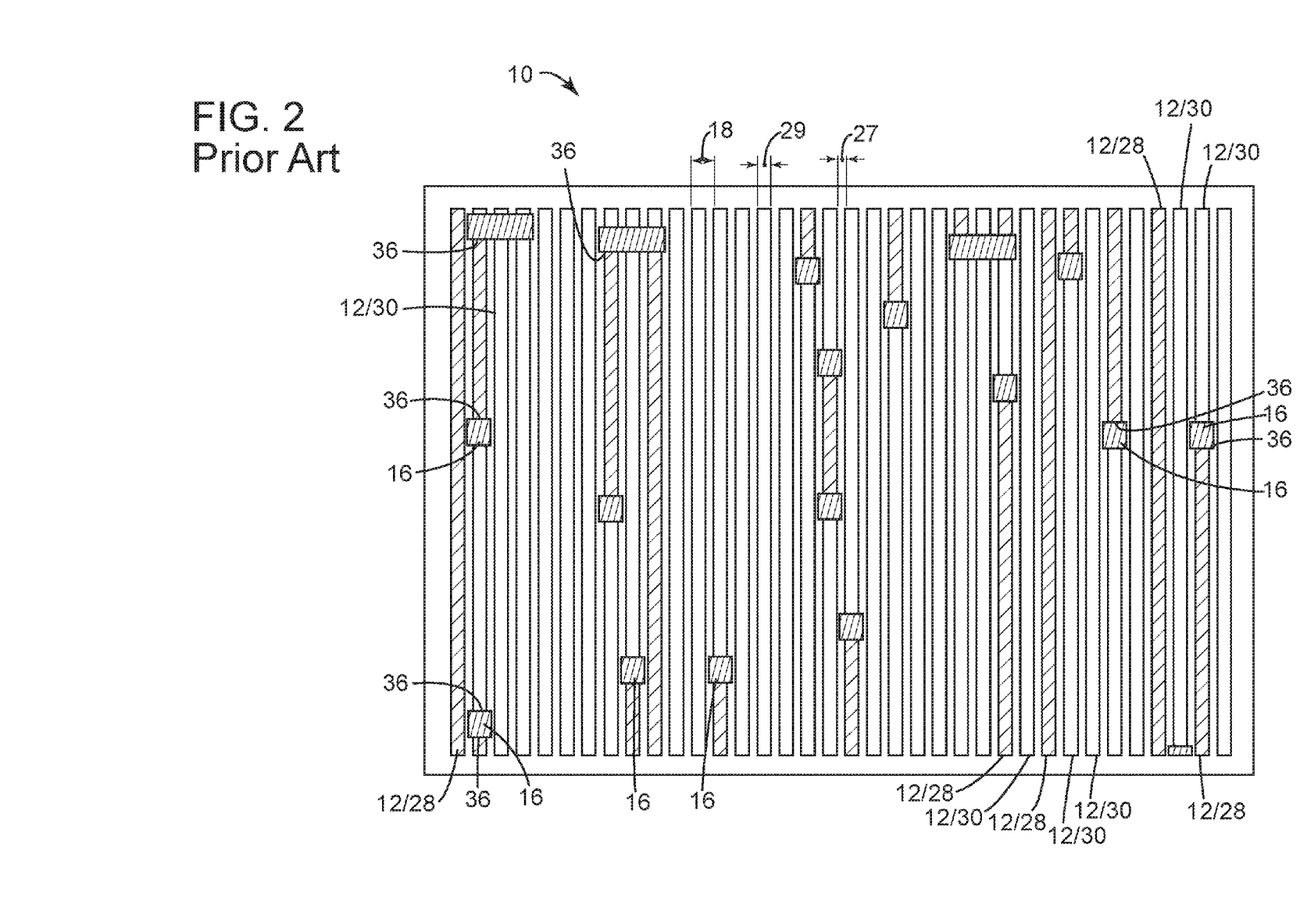
FIG. 2, is a top view of an exemplary embodiment of a prior art semiconductor structure having a plurality of the substantially parallel metal lines disposed in a dielectric layer.

Referring to FIG. 2, a top view of an exemplary embodiment of the prior art semiconductor structure 10 is presented. Structure 10 includes a plurality of the substantially parallel metal lines 12 disposed in a dielectric layer 26 (best seen in FIG. 3).

The pitch 18 of the metal lines 12, in this particular exemplary embodiment, is set at a dense 40 nm. Additionally, for this exemplary embodiment, the spaces 27 between the metal lines 12 and the widths 29 of the metal lines 12 are set equal to 20 nm each.

The metal lines 12 include both active lines 28 and dummy lines 30. The active lines 28 are for routing signals, or power, to and from semiconductor devices 32 disposed in a substrate 34 (best seen in FIG. 3) of structure 10. The dummy lines 30 do not route signals, or power, to and from the devices 32. A plurality of signal cuts 16 are disposed in the active lines 28 and define active metal line tips 36, which locate the distal ends of the active lines 28.

Problematically however, the signal cuts 16 form a generally sparsely distribute pattern across the dense sea of metal lines 12 disposed over structure 10. That is, most of the signal cuts 16 are separated by a distance of more than three pitch lengths (i.e., 120 nm). As such, the distortion problems and variations of CD discussed earlier are greatly exacerbated.

Figure 3:
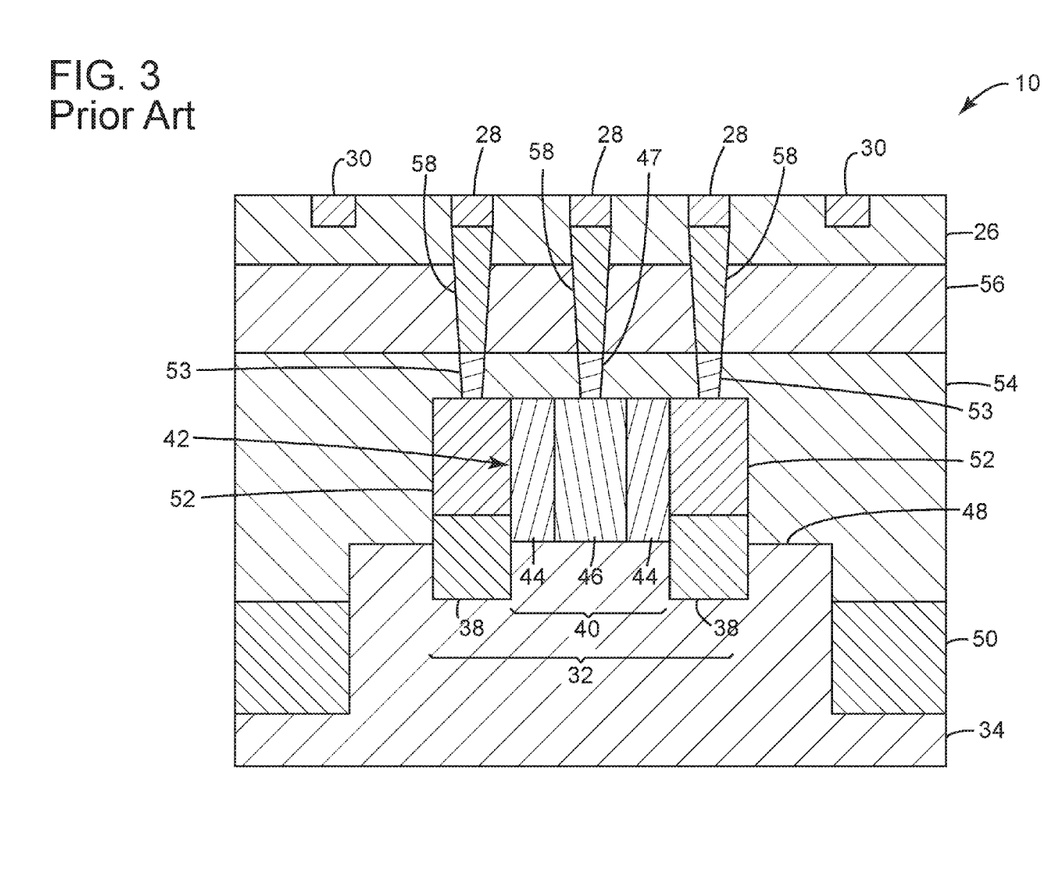
FIG. 3 is a prior art side view of the exemplary embodiment of FIG. 2.

Referring to FIG. 3, a partial side view of a portion of the semiconductor structure 10 is presented. In this exemplary embodiment a representative semiconductor device 32 is shown electrically connected to active lines 28, therefore enabling the active lines 28 to route signals, or power, to and from the device 32. Additionally, the semiconductor device 32 is not electrically connected to dummy lines 30 such that the dummy lines 30 do not route signals, or power, to and from the device 32.

The semiconductor device 32 in this embodiment is a Fin Field Effect Transistor (FinFET) 32, but can be any device which can be manufactured with semiconductor technology. For example device 32 could be another type of transistor, a resistor, a capacitor or the like.

FinFET 32, in this case, has two source drain regions 38 connected in between by a channel 40. FinFET 32 also includes a gate 42, which is operable to control the channel 40 of FinFET 32. The gate includes gate spacers 44 and gate metal 46. Extending upwards from the gate metal is a CB contact 47.

The FinFET 32 is imbedded in a fin 48, which is an integral part of substrate 34. A flowable oxide layer 50 surrounds a lower portion of fin 48. Extending upwards from the source-drain regions 38 is are trench silicide layers 52. Extending upwards from the trench silicide layers 52 are CA contacts 53. Covering the structure 10 up to at least the level of the gate metal 46, the trench silicide layers 52, the CB contacts 47 and the CA contacts 53 is an interlayer dielectric 54.

Disposed over the interlayer dielectric 54 is a complex stack of buried layers 56, which could be many combinations of layers depending on performance specifications. Disposed over the buried layers 56 is the dielectric layer 26, into which the active lines 28 and dummy lines 30 are disposed.

The active lines 28 are electrically connected to the source-drain regions 38 and gate 42 of semiconductor device 32 by a series of metal filled vias 58. In the case of the source-drain regions 38 specifically, the metal filled vias 58 contact the CA contacts 53, which provide electrical continuity to the trench silicide layers 52. The trench silicide layers 52 provide electrical continuity to the source-drain regions 38. In the case of the gate 42 specifically, the metal filled vias 58 contact the CB contact 47, which provides electrical continuity to the gate 42. The electrical connections from active lines 28 to device 32 through the vias 58 enables active lines 28 to route signals to and from the device 32. Notably, the dummy lines 30 are not electrically connected to any devices 32 and, therefore, cannot route any signals, or power, to and from any such devices 32.

Figure 4:
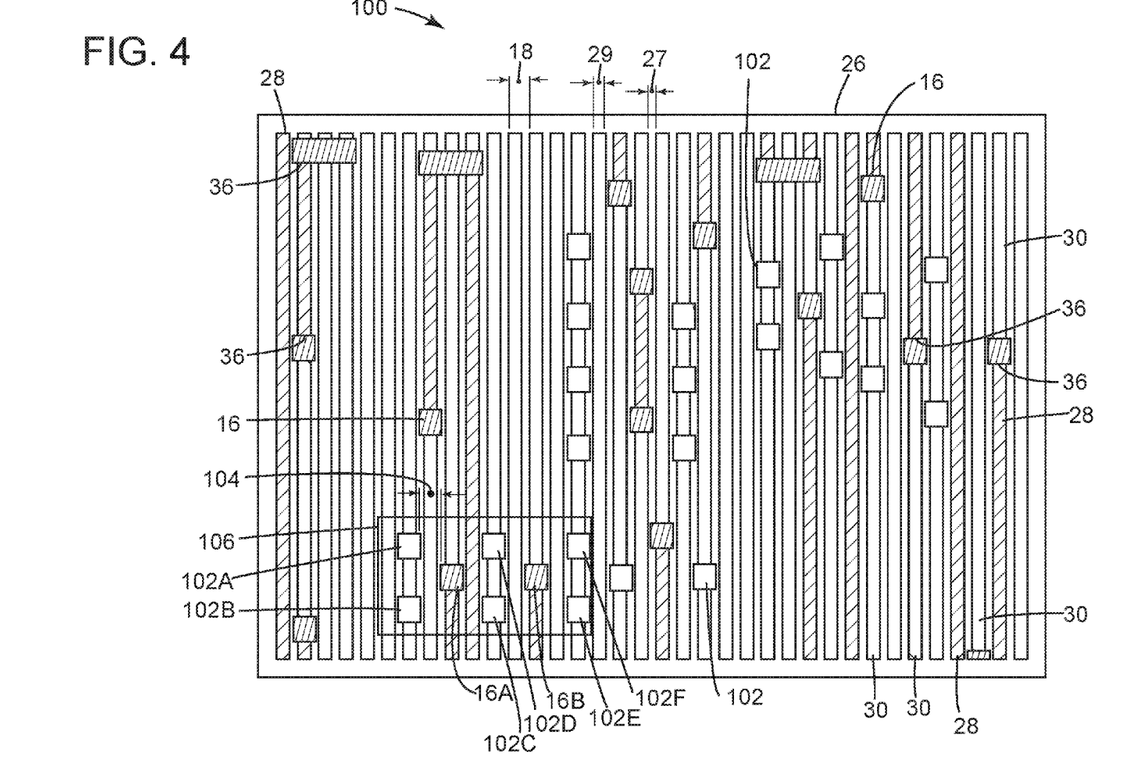
FIG. 4 is a top view of an exemplary embodiment of a semiconductor structure having signal cuts disposed in active lines and assist cuts disposed in dummy lines in accordance with the present invention.

Referring to FIG. 4, a top view of an exemplary embodiment of a semiconductor structure 100 in accordance with the present invention is presented. For this embodiment, structure 100 is identical to structure 10 accept for the addition of assist cuts 102 disposed exclusively in the dummy lines 30. Additionally, the assist cuts 102 do not define tips 36 of the active metal lines 28.

The assist cuts 102 are generally located proximate the signal cuts 16. In this exemplary embodiment the assist cuts (102A and 102B for example) are typically located within a distance 104 of less than two pitch 18 lengths from the nearest signal cut (16A for example).

As such a first density of assist cuts 102 and signal cuts 16 in an area surrounding the signal cuts 16 is substantially greater than a second density of signal cuts alone in the same area. By way of a specific example, if the generally rectangular shaped area 106 is considered to be a unit area, then there are two signal cuts 16A and 16B within that area 106. Additionally, within the area 106, there are 6 assist cuts 102A, B, C, D, E and F. Therefore, the first density of assist cuts 102 plus signal cuts 16 within the unit area 106 is equal to 8 cuts per unit area. Additionally, the second density of signal cuts 16 alone within that same unit area is equal to 2 cuts per unit area. Therefore the first density is 4 times greater than the second density within the area 106.

Moreover, given the entire illustrated area of the exemplary embodiment of structure 100, there are approximately 19 signal cuts 16 and approximately 24 assist cuts 102. Therefore the structure 100 has a first density of approximately 43 cuts per its entire area (i.e., 19 signal cuts plus 24 assist cuts). Structure 100 also has a second density of approximately 19 cuts per the same area (i.e., 19 signal cuts alone). As such the first density of assist cuts 102 and signal cuts 16 is at least two times the second density of signal cuts 102 alone for the entire structure 100.

Accordingly, the addition of the assist cuts 102 in the dummy lines 30 has converted the overall density of cuts (including both assist cuts 102 and signal cuts 16) to a denser pattern of cuts that is at least two times the density of the distribution of the signal cuts 16 alone. In the dense pattern of combined assist cuts 102 and signal cuts 16, the spaces between the cuts will approach the width of the cuts themselves.

Advantageously, by adding the assist cuts 102 to the signal cuts 16 to form a denser cut pattern, critical dimension (CD) variations typically become at least three times smaller than the variations for the cut pattern formed by the signal cuts alone.

Generally, for best optimization results, the assist cuts 102 are sized to have an area that is substantially equal to the area of the nearest signal cut 16. In this particular exemplary embodiment, the assist cuts 102 are sized to have an area that is within plus or minus 5 percent of an area of the nearest signal cut 16. Even more specifically in this embodiment, the smallest square shaped assist cuts 102 and signal cuts 16 are substantially 20 nm wide by 20 nm long.

Figure 5:
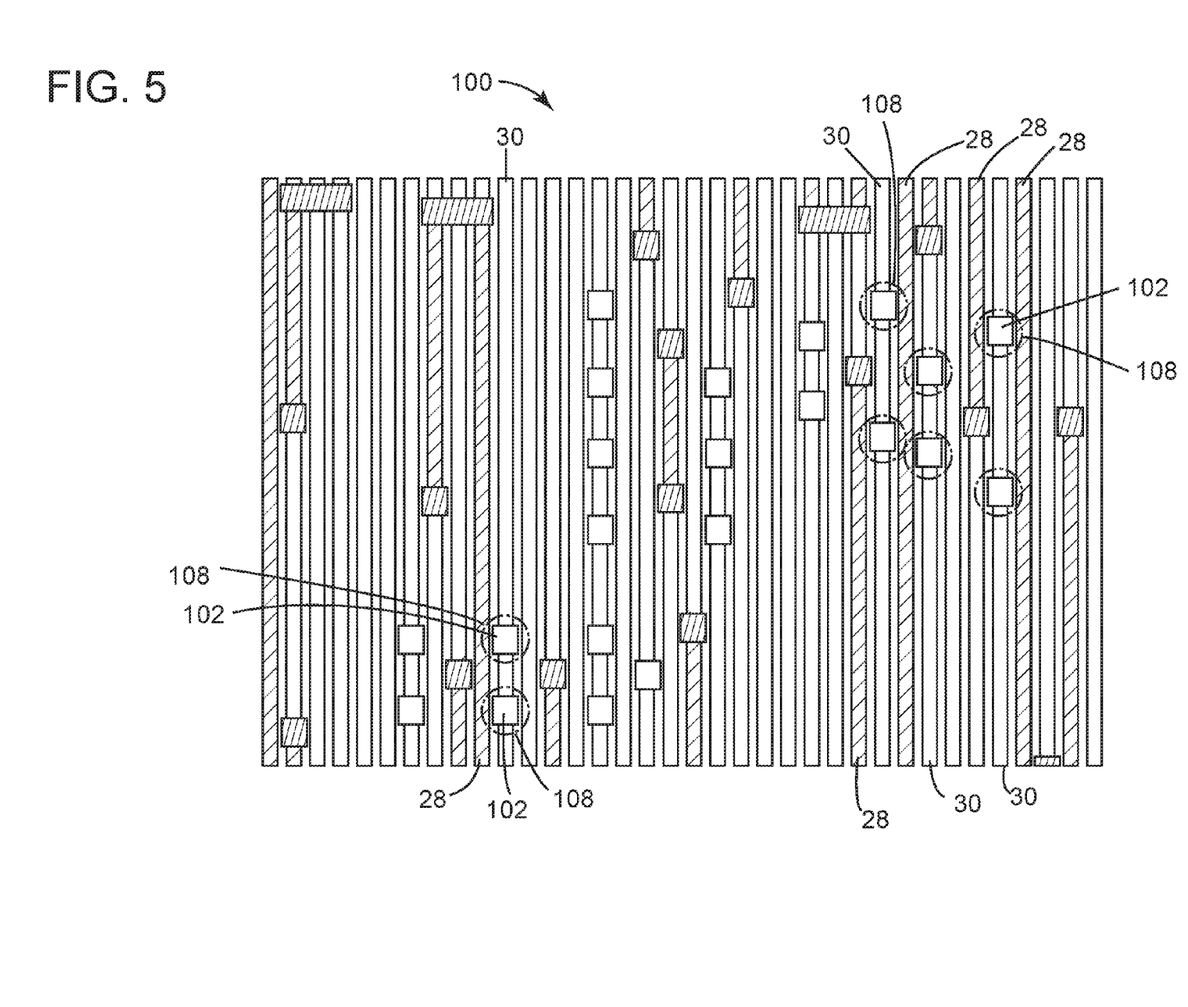
FIG. 5 is a top view of the exemplary embodiment of FIG. 4 wherein the assist cuts that are disposed adjacent active lines are illustrated within circular areas for emphasis.

Referring to FIG. 5, a top view of the exemplary embodiment of FIG. 4 is presented wherein the assist cuts 102 that are disposed adjacent active lines 28 are illustrated within circular areas 108. Often the assist cuts 102 are disposed within dummy lines 30 that are located adjacent active lines 28.

When an assist cut 102 is placed adjacent an active line 28, the assist cut is sized to have an area that is substantially less than an area of the nearest signal cut 16, which is generally the signal cut whose resolution is being enhanced by the assist cuts. Typically, these assist cuts 102 are sized to have an area that is at least 10 percent less than an area of the nearest signal cut 16. The reason for the downsizing is to substantially reduce the possibility of unwanted cuts 24 (best seen in FIG. 1C) into the adjacent signal lines 28.

Figure 6A:
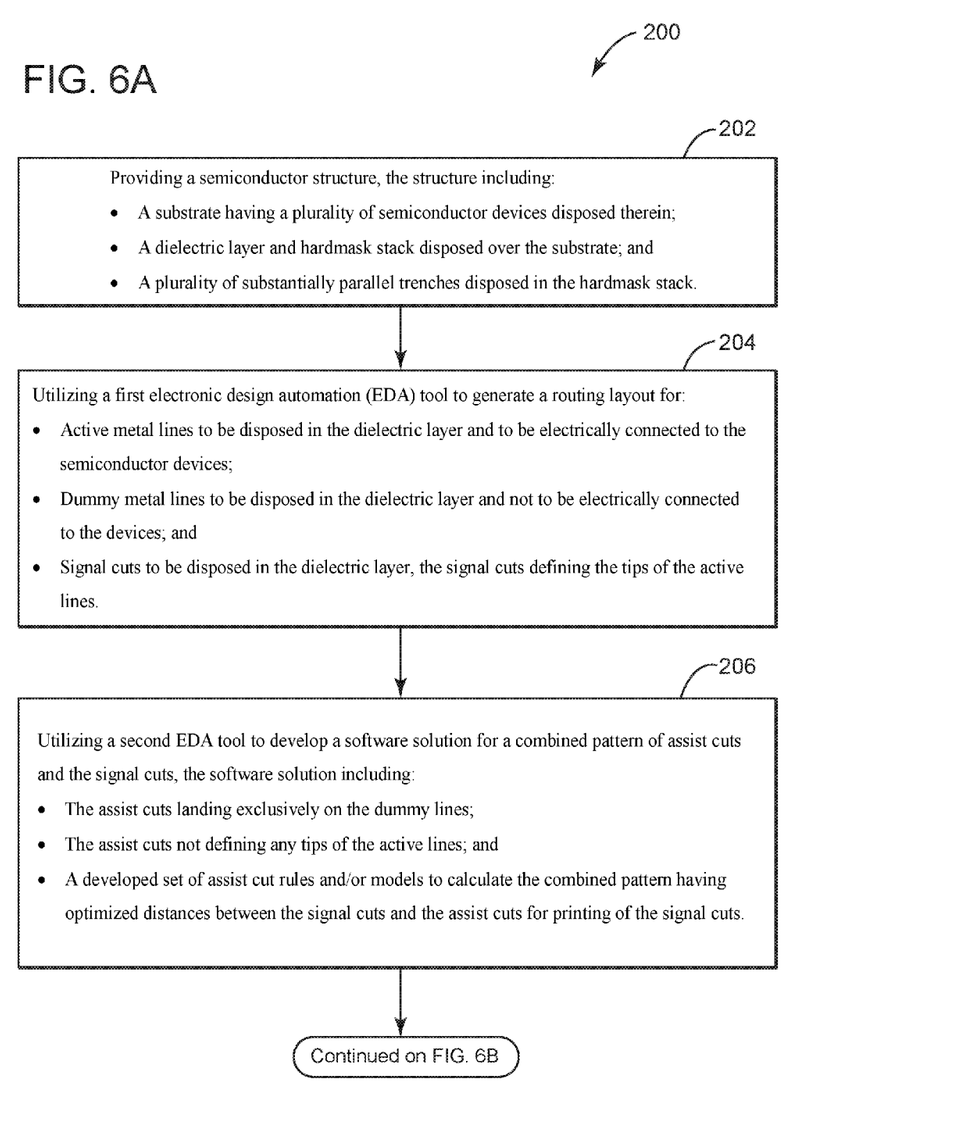
FIG. 6A is a flow diagram of a first portion of a method of making the semiconductor structure of FIG. 4 having assist cuts disposed in dummy lines to improve metal signal cuts in active lines in accordance with the present invention.
Figure 6B:
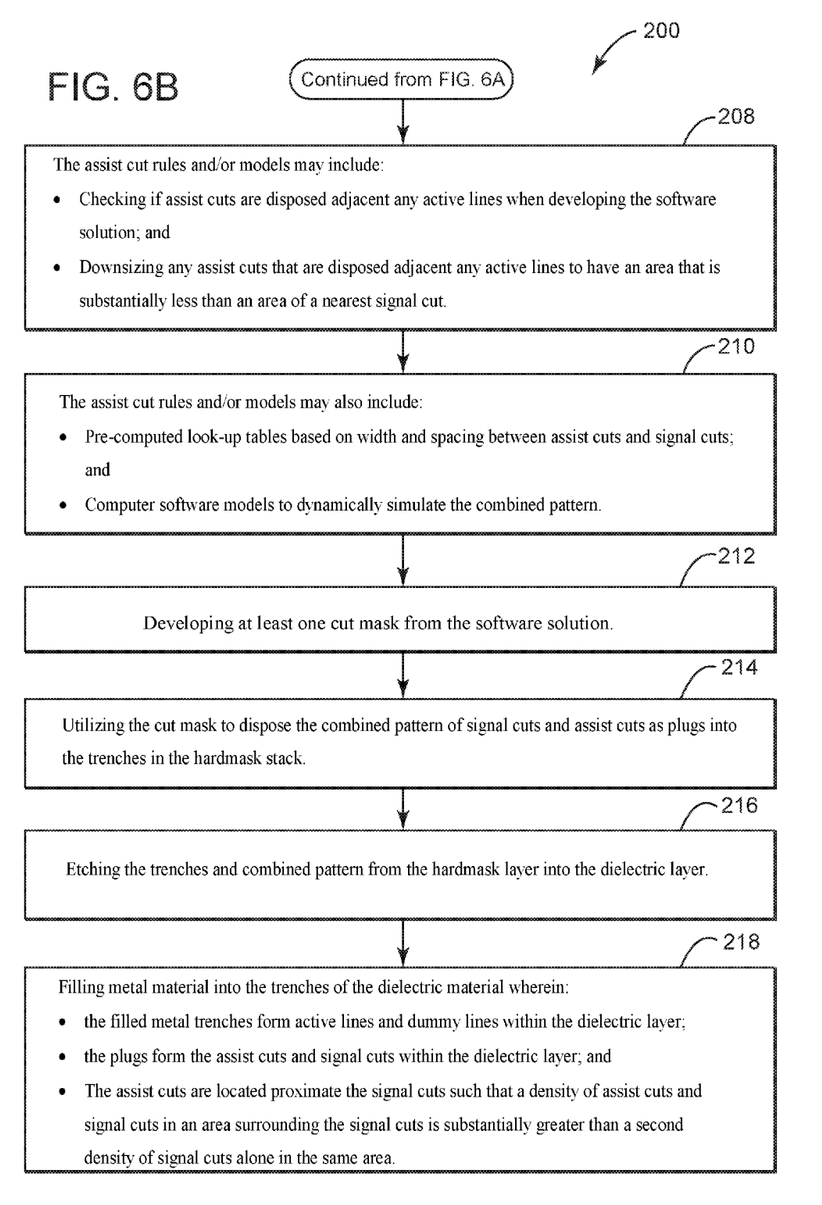
FIG. 6B is a second portion of the flow diagram of FIG. 6A in accordance with the present invention.

Referring to FIGS. 6A and 6B, a method 200 for disposing assist cuts in dummy lines to improve metal signal cuts in active lines of a semiconductor structure is presented. Method 200 includes a first step 202 of providing the semiconductor structure 100, wherein the structure 100 includes:

a substrate 34 having a plurality of semiconductor devices 32 disposed therein;

a dielectric layer 26 and hardmask stack (not shown) disposed over the substrate 34; and a plurality of substantially parallel trenches (not shown) disposed in the hardmask stack.

The dielectric layer 26 may be several layers above the substrate layer 34 (best be seen in FIG. 3). The hardmask stack includes at least one hardmask layer composed of material such as TiN, SiN or similar. The hardmask stack can be one or more layers depending upon performance needs and process flow requirements. The trenches may be disposed into the hardmask layer of the hardmask stack by a self-aligned multi-patterning technique, such as the well-known self-aligned double patterning (SADP) process.

Next in step 204 a first electronic design automation (EDA) tool is used to generate a routing layout for active metal lines 28, dummy lines 30 and signal cuts 16. The active metal lines 28 are to be disposed in the dielectric layer 26 and to be electrically connected to the semiconductor devices 32. The dummy metal lines 30 are to be disposed in the dielectric layer 26 and not to be electrically connected to the devices 32. The signal cuts 16 are to be disposed in the dielectric layer 26, wherein the signal cuts 16 define the tips 36 of the active lines 28.

EDA tools are a category of software tools for designing ultra-high density integrated circuits. EDA tools are typically utilized to design and analyze entire semiconductor systems for a semiconductor structure. The EDA tool in this exemplary embodiment (such as, for example, a router) calculates the routing layout or pattern defined by the signal cuts 16 and those portions of the metal lines 12 that become the active lines 28 and those portions of the metal lines 12 that become the dummy lines 30.

Next in step 206 a second EDA tool is used to develop a software solution for a combined pattern of assist cuts 102 and the signal cuts 16. The software solution includes the assist cuts 102 landing exclusively on the dummy lines 30, and the assist cuts 102 not defining any tips 36 of the active lines 28.

Additionally, the software solution includes the development of set of assist cut rules and/or a set of models to calculate the combined pattern, wherein the pattern has optimized distances between the signal cuts and the assist cuts for printing of the signal cuts. More specifically, the pattern is optimized with a goal to print the sharpest resolution signal cuts possible for the technology being utilized.

The second EDA tool may be an optical correction proximity (OPC) tool. OPC is generally used to compensate for photolithographic image errors due to diffraction or other process effects. These image errors cause irregularities in the targeted image on a semiconductor structure 100 such as line widths that are narrower or wider than designed. The software solution generated by an OPC tool can compensate for these irregularities by changing the pattern on the photomask used for imaging.

Proceeding to step 208, the developed set of assist cut rules and or set of models can be broadened to include a calculated check to determine if any assist cuts 102 are disposed adjacent any active lines 28. If so, then in order to significantly reduce the possibility of unwanted cuts 24 (best seen in FIG. 1C) in those active lines 28, the adjacent assist cuts 102 will be downsized relative to the nearest signal cut 16. That is, the assist cuts 102 may typically be downsized to have an area that is at least 10 percent less than an area of the nearest signal cut 16.

Proceeding to step 210, in order to achieve the overall objective of printing the signal cuts 16 as close as possible to the original targeted design of those signal cuts 16, the set of assist cut rules and/or set of models may further include pre-computing look-up tables based on width and spacing between assist cuts 102 and signal cuts 16. Additionally to achieve the same objective, the assist cut rules may also include developing computer software models to dynamically simulate the combined pattern of assist cuts 102 and signal cuts 16.

Once the software solution has been developed, the next step 212 is to develop at least one cut mask from the software solution. In step 214, the cut mask is used to dispose the combined pattern of signal cuts 16 and assist cuts 102 as plugs into the trenches in the hardmask stack. In step 216, the trenches and combined pattern are then etched (as for example by a reactive ion etching process) down from the hardmask stack to the dielectric layer 26.

Proceeding to step 218, metal material is utilized to fill the trenches of the dielectric material. This can be done by chemical vapor deposition, physical vapor deposition or the like. The excess metal can then be polished off of the top of the dielectric.

Once the trenches have been metalized, the filled metal trenches form the active lines 28 and dummy lines 30 within the dielectric layer. Additionally, the plugs form the assist cuts 102 and signal cuts 16 within the dielectric layer. The assist cuts 102 are located proximate the signal cuts 16 such that a density of assist cuts 102 and signal cuts 16 in an area 106 surrounding the signal cuts 16 is substantially greater than a second density of signal cuts 16 alone in the same area 106.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A semiconductor structure comprising:
   a substrate having a plurality of semiconductor devices disposed therein;
   a dielectric layer disposed over the substrate;
   a plurality of metal lines extending parallel to each other in a longitudinal direction, the metal lines disposed in the dielectric layer, the metal lines having a uniform pitch and width, the metal lines including:
      active lines for routing signals to and from the devices, and
      dummy lines which do not route signals to and from the devices;
   signal cuts disposed in the metal lines, each signal cut extending in a direction perpendicular to the longitudinal direction and across a width of a metal line, each signal cut defining a pair of tips for a pair of metal lines aligned in the longitudinal direction on opposing sides of the signal cut, wherein at least one such tip is a tip for an active line; and assist cuts disposed in the dummy lines, each assist cut extending in the direction perpendicular to the longitudinal direction and across a width of a metal line, each assist cut defining a pair of tips for a pair of dummy lines aligned in the longitudinal direction on opposing sides of the assist cut, the assist cuts located proximate the signal cuts such that a first density of assist cuts and signal cuts combined in an area symmetrically surrounding the signal cuts is greater than a second density of signal cuts alone in the same area; and wherein the assist cuts on the dummy lines disposed adjacent the active lines are sized to have an area that is at least 10 percent less than an area of the nearest signal cut.

2. The semiconductor structure of claim 1 wherein the first density of assist cuts and signal cuts is at least two times the second density of the signal cuts alone.

3. The semiconductor structure of claim 1 wherein the first density of assist cuts and signal cuts is at least four times the second density of the signal cuts alone.

4. The semiconductor structure of claim 1 wherein the metal lines have a pitch of 80 nm or less.

5. The semiconductor structure of claim 1 wherein the metal lines have a pitch of 40 nm or less.

6. The semiconductor structure of claim 1 wherein the width of the signal cuts is equal to 30 nm or less.

7. The semiconductor structure of claim 1 comprising:
the signal cuts alone being separated by spaces that are more than three times the widths of the signal cuts; and
the assist cuts and signal cuts combined being separated by spaces that are less than three times the widths of the signal cuts.

8. The semiconductor structure of claim 1 wherein the assist cuts are sized to have an area that is within plus or minus 5 percent of an area of the nearest signal cut.

9. The semiconductor structure of claim 1 wherein the active lines for routing signals to and from the devices include active lines for routing electric power to and from the devices.

* * * * *